(12) United States Patent
Oh

(10) Patent No.: US 9,036,392 B2
(45) Date of Patent: May 19, 2015

(54) REDUNDANCY CIRCUIT FOR REDUCING CHIP AREA

(75) Inventor: Heung-Taek Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 469 days.

(21) Appl. No.: 13/207,650

(22) Filed: Aug. 11, 2011

(65) Prior Publication Data

US 2012/0086501 A1    Apr. 12, 2012

(30) Foreign Application Priority Data

Oct. 12, 2010    (KR) .................. 10-2010-0099245

(51) Int. Cl.
| | |
|---|---|
| *G11C 17/00* | (2006.01) |
| *H03K 19/003* | (2006.01) |
| *G11C 29/00* | (2006.01) |
| *G11C 17/16* | (2006.01) |

(52) U.S. Cl.
CPC ........ *H03K 19/00392* (2013.01); *G11C 29/787* (2013.01); *G11C 17/16* (2013.01)

(58) Field of Classification Search
USPC ........................................ 365/96, 225.7, 200
See application file for complete search history.

(56) References Cited

U.S. PATENT DOCUMENTS

| 7,359,243 B2 * | 4/2008 | Ha ........................... 365/185.09 |
| 7,359,274 B2 * | 4/2008 | Noguchi et al. ......... 365/230.03 |
| 7,619,921 B2 * | 11/2009 | Hosono et al. ........... 365/185.09 |

* cited by examiner

*Primary Examiner* — Kretelia Graham
(74) *Attorney, Agent, or Firm* — IP & T Group LLP

(57) ABSTRACT

A redundancy circuit includes a plurality of block address lines, a first fuse array storing a first data, a plurality of first local lines configured to supply a verification voltage to the first fuse array in response to a signal of a corresponding line among the plurality of block address lines, a second fuse array storing a second data, a plurality of second local lines configured to supply the verification voltage to the second fuse array in response to a signal of a corresponding line among the plurality of block address lines, and a plurality of verification lines configured to check the first data of the first fuse array and the second data of the second fuse array, wherein the plurality of verification lines are shared by the first fuse array and the second fuse array and are disposed between the first fuse array and the second fuse array.

5 Claims, 4 Drawing Sheets

US 9,036,392 B2

REDUNDANCY CIRCUIT FOR REDUCING CHIP AREA

CROSS-REFERENCE TO RELATED APPLICATIONS

The present application claims priority of Korean Patent Application No. 10-2010-0099245, filed on Oct. 12, 2010, which is incorporated herein by reference in its entirety.

BACKGROUND

1. Field

Exemplary embodiments of the present invention relate to a redundancy circuit.

2. Description of the Related Art

Sizes of components constituting a semiconductor integrated circuit are getting finer and the number of components included in a single semiconductor chip is significantly increasing, leading to an increase in a defect density. The increase in the defect density may lead to a reduction in the yield of a semiconductor device. In a serious case, a wafer on which a semiconductor device is to be formed may be discarded.

To lower a defect density, a redundancy circuit for replacing a defective cell with a redundancy cell has been suggested. For example, a semiconductor device may include redundancy circuits (or fuse circuits) in each row line (e.g., word line) and each column line (e.g., bit line), and a fuse array may be provided to store address information of defective cells. The fuse array includes a plurality of fuse sets each having a plurality of fuse lines. The fuse set may be programmed by selective laser blowing of fuse lines.

FIG. 1 is a configuration diagram of a conventional redundancy circuit.

Referring to FIG. 1, the conventional redundancy circuit includes a plurality of first block address lines 101, a plurality of first transistors 102, a first fuse array 103, a second fuse array 104, a plurality of second transistors 105, a plurality of second block address lines 106, a plurality of verification lines 107, a plurality of third block address lines 108, a plurality of third transistors 109, a third fuse array 110, a fourth fuse array 111, a plurality of fourth transistors 112, and a plurality of fourth block address lines 113. The above-mentioned components may be disposed in the above-mentioned order starting from the plurality of first block address lines 101 disposed at the top.

First to fourth verification voltage lines 114, 115, 116, and 117 are disposed to be spaced apart from the first to fourth block address lines 101, 106, 108, and 113, respectively. FIG. 2 is a configuration diagram illustrating a 2-stage arrangement of 2-row fuse sets (The respective stages of the fuse sets are identical to each other). The first to fourth fuse arrays 103, 104, 110, and 111 include a plurality of connection fuses 103C, 104C, 110A, and 111A for electrical connection to the verification lines 107.

The operation of the redundancy circuit will be described below with reference to FIG. 1.

Hereinafter, a case that one block address, e.g., an address of a block address line 106A, is activated among the plurality of addresses of first to fourth block address lines 101, 106, 109, and 113 will be described. If the block address is activated, the second transistors 105A and 105B corresponding thereto are activated. Therefore, the second fuses 104A and 104B included in the second fuse array 104 are electrically connected to the second verification voltage line 115. A verification voltage V1 is applied to the second verification voltage line 115, and a reference voltage V2 is applied to the plurality of verification lines 107.

If the second verification voltage line 115 and the second fuses 104A and 104B are electrically connected together, the voltages of the verification lines 107A and 107B are maintained at the reference voltage V2 when the second fuses 104A and 104B are cut. On the other hand, the voltages of the verification lines 107A and 107B are changed when the second fuses 104A and 104B are not cut (The verification lines 107A and 107B correspond the first and second fuses 104A and 104B, respectively.)

FIG. 2 illustrates the conventional extended redundancy circuit.

Specifically, FIG. 2 illustrates a 4-stage arrangement of 2-row fuse sets. The configuration of a first redundancy unit 201 and a second redundancy unit 202 is almost identical to the configuration of the redundancy circuit of FIG. 1. The first redundancy unit 201 and the second redundancy unit 202 share a fourth block address line 113. A description as to their detailed configuration is omitted, and only lines 101, 106, 107, 108, 114, 115, 116, and 117 and a fuse guard 118 including the fuse array 103, 104, 110, or 111 are illustrated. The connection of the respective components and the internal configuration of the fuse guard 118 are substantially identical to those of FIG. 1. At this time, the lines to which the same serial number is assigned as FIG. 1 indicate that the same signal is applied thereto.

In the conventional art, the first to third block address lines 101, 106, and 108 are repeatedly arranged. In addition, the fuse guard 118 for protecting the fuses from water that may get through from the exterior is formed at every 2-row fuse set. Accordingly, due to the overlapping arrangement of the plurality of block address lines 101, 106, and 108 and the formation of the fuse guard 118 at every 2-row fuse set, a chip area is significantly increased as the number of the stages of the 2-row fuse sets is increased.

SUMMARY

An embodiment of the present invention is directed to reduce a chip area by arranging a plurality of verification lines between fuse arrays without arranging block address lines repeatedly.

In accordance with an embodiment of the present invention, a redundancy circuit includes: a plurality of block address lines; a first fuse array configured to store a first data; a plurality of first local lines configured to supply a verification voltage to the first fuse array in response to a signal of a corresponding line among the plurality of block address lines; a second fuse array configured to store a second data; a plurality of second local lines configured to supply the verification voltage to the second fuse array in response to a signal of a corresponding line among the plurality of block address lines; and a plurality of verification lines configured to check the first data of the first fuse array and the second data of the second fuse array, wherein the plurality of verification lines are shared by the first fuse array and the second fuse array and are disposed between the first fuse array and the second fuse array.

In accordance with another embodiment of the present invention, a redundancy circuit includes: a plurality block address lines configured to transfer a plurality block addresses; a plurality of first local lines disposed on the side of the plurality of block address lines and supplied with a verification voltage when a corresponding address is activated among the plurality of block addresses; a first fuse array disposed on the side of the plurality of first local lines; a second array disposed on the side of the first fuse array; a plurality of second local lines disposed on the side of the second fuse array and supplied with the verification voltage when a corresponding address is activated among the plurality of block addresses; a plurality of first verification lines configured to check a program state of the first fuse array and the second fuse array using a reference voltage and disposed between the first fuse array and the second fuse array; a plurality of third local lines disposed on the side of the plurality of second local lines and supplied with the verification voltage when a corresponding address is activated among the plurality of block addresses; a third fuse array disposed on the side of the plurality of third local lines; a fourth fuse array disposed on the side of the third fuse array; a plurality of fourth local lines disposed on the side of the fourth fuse array and supplied with the verification voltage when a corresponding address is activated among the plurality of block addresses; and a plurality of second verification lines configured to check a program state of the third fuse array and the fourth fuse array using the reference voltage and disposed between the third fuse array and the fourth fuse array.

DETAILED DESCRIPTION

Figure 1:
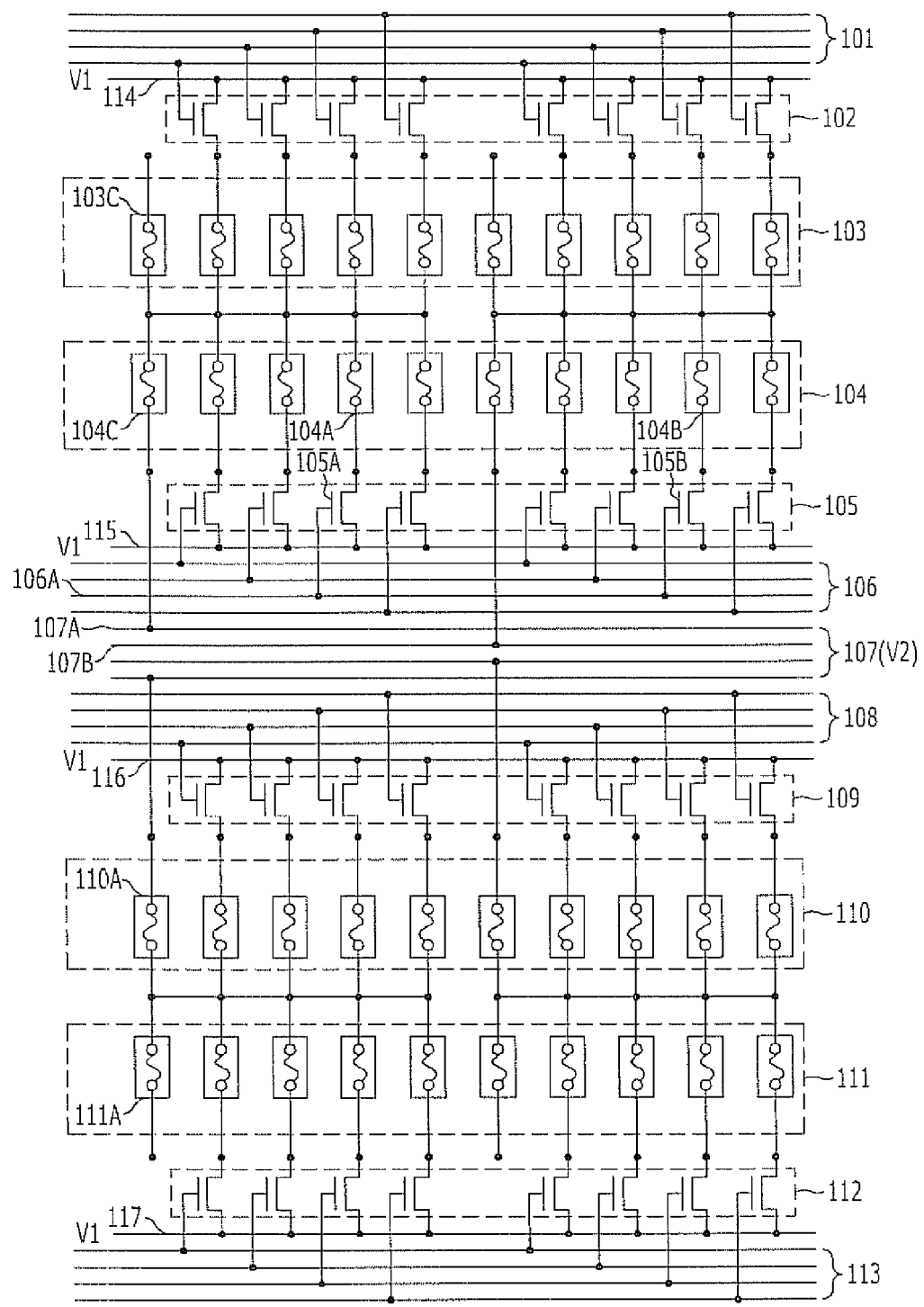
FIG. 1 is a configuration diagram of a conventional redundancy circuit.

Exemplary embodiments of the present invention wilt be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. In the drawings, an upper portion or a lower portion is a relative position of each configuration and is not intended to indicate an upper portion of an actual chip.

Figure 3:
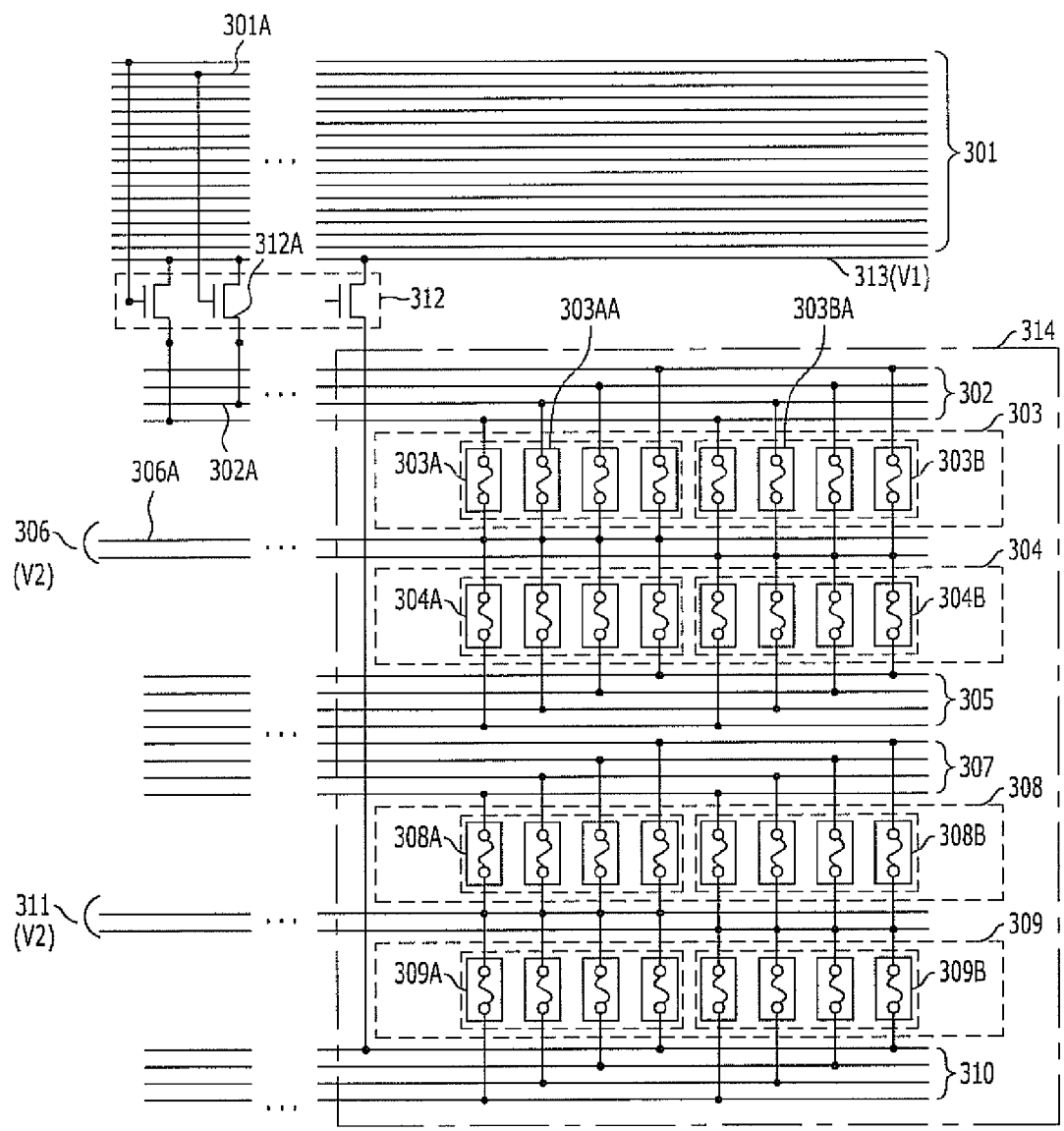
FIG. 3 is a configuration diagram of a redundancy circuit in accordance with an embodiment of the present invention.

FIG. 3 is a configuration diagram of a redundancy circuit in accordance with an embodiment of the present invention.

Referring to FIG. 3, a plurality block address lines 301 may be disposed at the uppermost portion of the redundancy circuit. A plurality of first local lines 302 are disposed under the plurality of block address lines 301 and supplied with a verification voltage V1 when an address of a corresponding line among the plurality of block address lines 301 is activated. A first fuse array 303 is disposed under the plurality of first local lines 302 and corresponds to the plurality of first local lines 302. A second fuse array 304 is disposed under the first fuse array 303. A plurality of second local lines 305 are disposed under the second fuse array 304 and correspond to the second fuse array 304. The second local lines 305 are supplied with a verification voltage V1 when an address of a corresponding line among the plurality of block address lines 301 is activated. A plurality of first verification lines 306 are shared by the first fuse array 303 and the second fuse array 304 and are disposed between the first fuse array 303 and the second fuse array 304. A plurality of third local lines 307 are disposed under the plurality of second local lines 305 and are supplied with the verification voltage V1 when an address of a corresponding line among the plurality of block address lines 301 is activated. A third fuse array 308 is disposed under the plurality of third local lines 307 and corresponds to the plurality of third local lines 307. A fourth fuse array 309 is disposed under the third fuse array 308. A plurality of fourth local lines 310 are disposed under the fourth fuse array 309 and correspond to the fourth fuse array 309. The fourth local lines 310 are supplied with the verification voltage V1 when an address of a corresponding line among the plurality of block address lines 301 is activated. A plurality of second verification lines 311 are shared by the third fuse array 308 and the fourth fuse array 309 and are disposed between the third fuse array 308 and the fourth fuse array 309.

A plurality of transistors 312 apply the verification voltage V1 to any one of the plurality of first to fourth local lines 302, 305, 307, and 310 when an address of a corresponding line among the plurality of block address lines 301 is activated. The plurality of transistors 312 are disposed between the plurality of block address lines 301 and the plurality of first local lines 302.

A verification voltage line 313 is configured to supply the verification voltage V1 to the transistors 312. The verification voltage line 313 is disposed between the plurality of block address lines 301 and the plurality of transistors 312.

The fuse arrays 303, 304, 308, and 309 may include one or more fuse blocks 303A, 303B, 304A, 304B, 308A, 308B, 309A and 309B. The fuse blocks 303A, 3036, 304A, 304B, 308A, 308B, 309A, and 309B refer to a set of a plurality of fuses sharing a single verification line 306 or 311. In addition, the number of the lines included in the plurality of block address lines 301 is equal to the number of the local lines included in the first to fourth local lines 302, 305, 307, and 310. The operation of redundancy circuit in which two fuse blocks are included in the fuse arrays 303, 304, 308, and 309, four fuses are included in the fuse blocks 303A, 303B, 304A, 304B, 308A, 3086, 309A, and 309B, sixteen lines are included in the plurality of block address lines 301, and four local lines are included in the first to fourth local lines 302, 305, 307, and 310, respectively, will be described below as an example.

The operation of the redundancy circuit will be described below with reference to FIG. 3.

For example, when an address of one block address line 301A among the plurality of block address lines 301 is activated, the corresponding transistor 312A electrically connects the verification voltage line 313 to the corresponding first local line 302A.

The plurality of verification lines 306 and 311 are supplied with the reference voltage V2 for determining whether the fuse corresponding to the block address line 301A among the fuses included in the first to fourth fuse arrays 303, 304, 308, and 309 is programmed. At this time, the first local line 302A corresponds to a fuse in each the fuse blocks 303A and 303B of the first fuse array 303. Therefore, it is determined whether two fuses 303AA and 303BA of the first fuse array 303 are programmed based on the voltage of the first verification line 306A.

If the first fuses 303AA and 303BA are cut, the voltage of the first verification line 306A is maintained at the reference voltage V2. On the other hand, when the first fuses 303AA and 303BA are not cut, the voltage of the first verification line 306A is changed, instead of being maintained at the reference voltage V2. When other addresses of the block address lines 301 are activated, the operation is identical to that described above.

The first to fourth fuse arrays 303, 304, 308, and 309 are disposed within the fuse guard 314. The fuse guard 314 refers to a metal layer formed around the fuse in order to prevent the fuse from being damaged by water penetrating from the exterior.

In accordance with the exemplary embodiments of the present invention, the fuses may be arranged in 2 or more rows by disposing local lines or verification lines between the fuse arrays. Therefore, the fuse guard 314 need not be separately formed at each stage of the 2-row fuse set. In addition, a chip area is significantly reduced by disposing a plurality of fuse rows within a single fuse guard.

Referring again to FIG. 3, the redundancy circuit in accordance with the embodiment to the present invention will be described below.

Referring to FIG. 3, the redundancy circuit in accordance with the embodiment of the present invention includes: the plurality of block address lines 301; the plurality of first local lines 302 supplied with the verification voltage V1 when an address of the corresponding line among the plurality of block address lines 301 is activated; the first fuse array 303 corresponding to the plurality of first local lines 302; the plurality of second local lines 305 supplied with the verification voltage V1 when an address of the corresponding line among the plurality of block address lines 301 is activated; the second fuse array 304 corresponding to the plurality of second local lines 305; and the plurality of verification lines 306 for checking data of the first fuse array 303 and the second fuse array 304. The plurality of verification lines 306 are shared by the first fuse array 303 and the second fuse array 304 and are disposed between the first fuse array 303 and the second fuse array 304.

The redundancy circuit includes a plurality of transistors 312 configured to apply the verification voltage V1 to the corresponding local line among the plurality of first local lines 302 or the plurality of second local lines 305 when an address of the corresponding block address line among the plurality of block address lines 301 is activated. The plurality of transistors 312 are disposed between the plurality of block address lines 301 and the plurality of first local lines 302. The redundancy circuit includes a verification voltage line 313 configured to supply the verification voltage V1 to the transistors 312.

The first fuse array 303 and the second fuse array 304 are disposed between the plurality of first local lines 302 and the plurality of second local lines 305, and the first fuse array 303 and the second fuse array 304 are disposed within the fuse guard 314. In this configuration, if the arrangement of the plurality of local lines, the plurality of fuse arrays, and the plurality of verification lines is added in the above-mentioned manner, the redundancy circuit may be extended. In the case of FIG. 3, the redundancy circuit is extended by adding a plurality of third local lines 307, a plurality of fourth local lines 310, a third fuse array 308, a fourth fuse array 309, and a plurality of second verification lines 311 to the above-mentioned configuration. The operation of the extended redundancy circuit is substantially identical to that described above with reference to FIG. 3.

Figure 4:
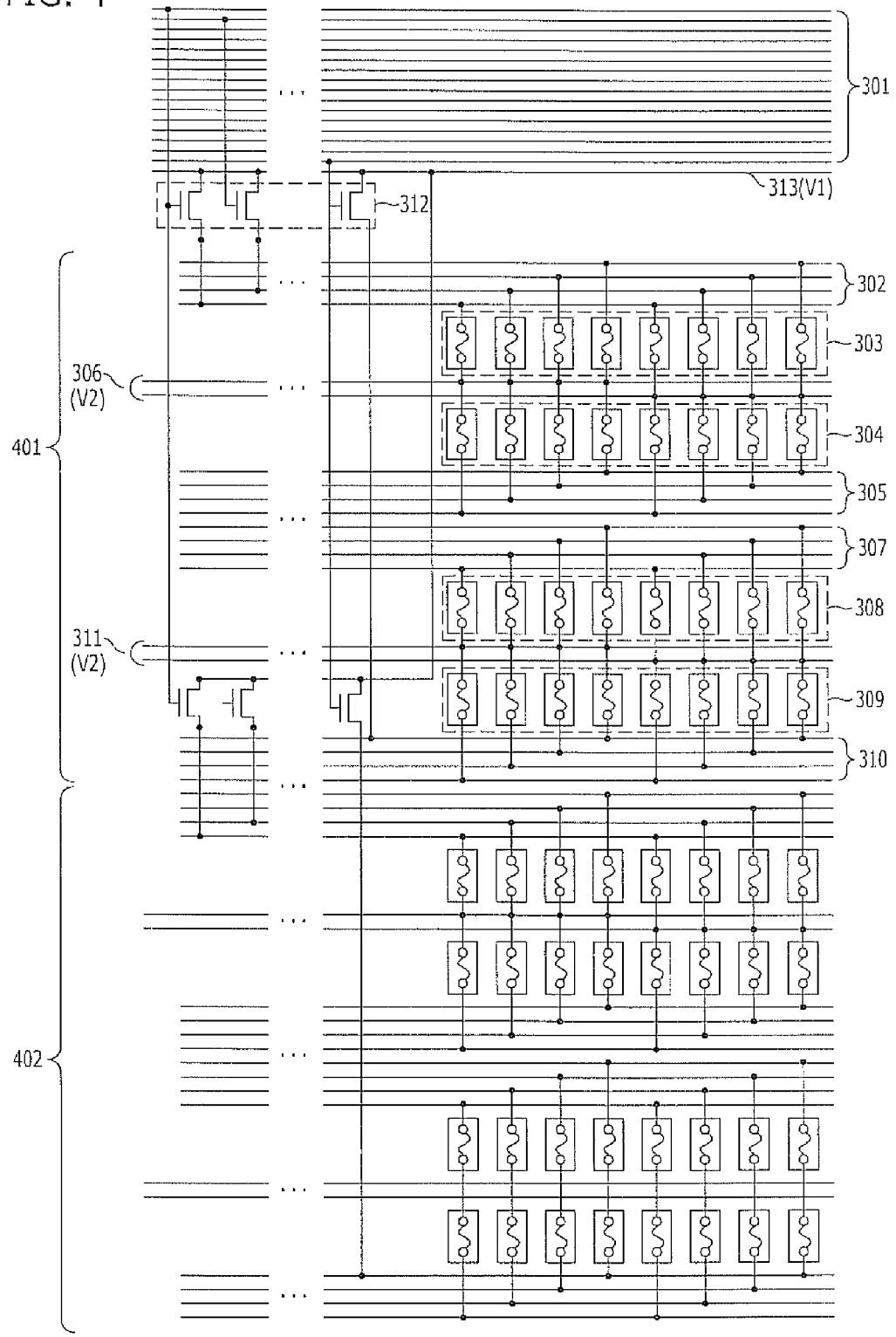
FIG. 4 illustrates the extended redundancy circuit of FIG. 3.

FIG. 4 illustrates the extended redundancy circuit of FIG. 3.

Referring to FIG. 4, the 4-row fuse set of FIG. 3 is extended to an 8-row fuse set. The configuration of the second redundancy unit 402 is substantially identical to that of the first redundancy unit 401, and the first redundancy unit 401 and the second redundancy unit 402 share the plurality of block address lines 301. The operation of the second redundancy unit 402 is substantially identical to that of the first redundancy unit 401.

Figure 2:
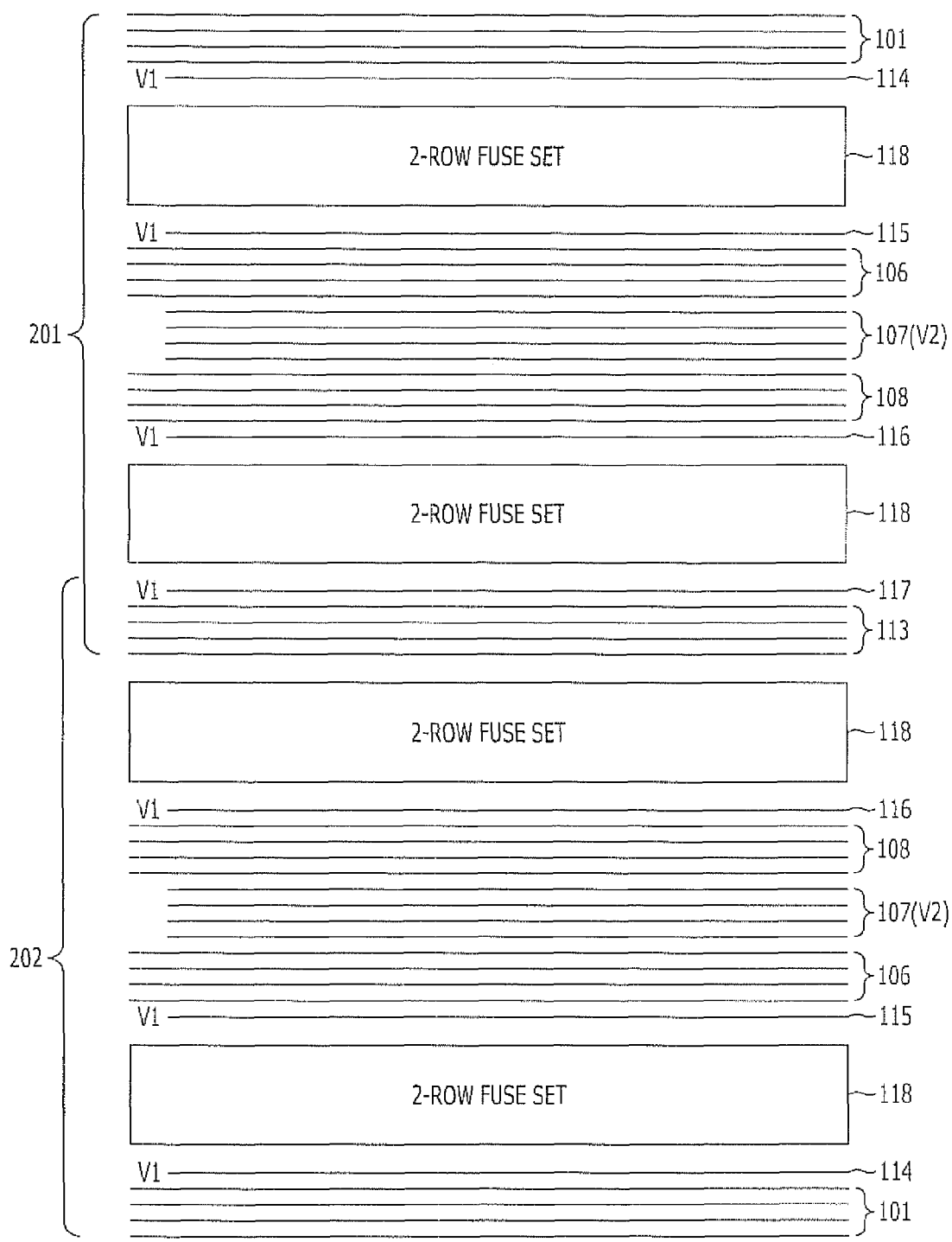
FIG. 2 illustrates the conventional extended redundancy circuit.

In accordance with the embodiment of the present invention, the overlapping block address lines are eliminated and all the fuse arrays are disposed within one fuse guard 314. Therefore, a chip area is not significantly increased even though the number of the fuse arrays is increased. That is, even though the number of the fuse arrays is increased, the redundancy circuit in accordance with the embodiment of the present invention occupies a small area as compared to the conventional redundancy circuit of FIG. 2.

In the redundancy circuit set forth above, the overlapping block address lines are eliminated, and the plurality of verification lines or local lines are disposed between fuse arrays. Therefore, fuses may be arranged in 2 or more rows, leading to a reduction in a chip area.

While the present invention has been described with respect to the specific embodiments, it will be apparent to those skilled in the art that various changes and modifications may be made without departing from the spirit and scope of the invention as defined in the following claims.

What is claimed is:

1. A redundancy circuit comprising:
   a first fuse array configured to store a first data;
   a plurality of first block address lines corresponding to the first fuse array;
   a plurality of first local lines configured to supply a verification voltage to the first fuse array in response to a signal of a corresponding line among the plurality of first block address lines;
   a second fuse array configured to store a second data;
   a plurality of second block address lines corresponding to the second fuse array;
   a plurality of second local lines configured to supply the verification voltage to the second fuse array in response to a signal of a corresponding line among the plurality of second block address lines; and
   a plurality of verification lines configured to check the first data of the first fuse array and the second data of the second fuse array,
   wherein the plurality of verification lines are shared by the first fuse array and the second fuse array and are disposed between the first fuse array and the second fuse array, and the plurality of first block address lines corresponding to the first fuse array and the plurality of second block address lines corresponding to the second fuse array are disposed as one group at a portion of the redundancy circuit,
   wherein the first fuse array and the second fuse array are disposed between the plurality of first local lines and the plurality of second local lines.

2. The redundancy circuit of claim 1, wherein the first fuse array and the second fuse array are disposed within a fuse guard.

3. The redundancy circuit of claim 1, further comprising:
   a plurality of transistors configured to apply the verification voltage to a corresponding local line among the plurality of first local lines or the plurality of second local lines when a signal of a corresponding block address line among the plurality of first block address lines or the plurality of second block address lines is activated,
   wherein the plurality of transistors are disposed between the plurality of block address lines and the plurality of first local lines.

4. The redundancy circuit of claim 3, further comprising:
a verification voltage line configured to supply the verification voltage to the transistors.

5. The redundancy circuit of claim 1, wherein a reference voltage is supplied to the plurality of verification lines to check a program state of a fuse of the first and second fuse arrays, and the first and second fuse arrays are supplied with the verification voltage through the plurality of first local lines or the plurality of second local lines.

* * * * *